United States Patent
Zakar

(10) Patent No.: US 11,456,358 B2
(45) Date of Patent: Sep. 27, 2022

(54) MASKLESS PATTERNING AND CONTROL OF GRAPHENE LAYERS

(71) Applicant: U.S. Army Combat Capabiities Development Command, Army Research Laboratory, Adelphi, MD (US)

(72) Inventor: Eugene S. Zakar, Bethesda, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 202 days.

(21) Appl. No.: 16/748,364

(22) Filed: Jan. 21, 2020

(65) Prior Publication Data
US 2021/0226014 A1   Jul. 22, 2021

(51) Int. Cl.
*H01L 29/16* (2006.01)
*H01L 21/02* (2006.01)
*C01B 32/186* (2017.01)

(52) U.S. Cl.
CPC ........ *H01L 29/1606* (2013.01); *C01B 32/186* (2017.08); *H01L 21/02527* (2013.01)

(58) Field of Classification Search
CPC ........ H01L 35/18; H01L 35/20; H01L 35/22; H01L 35/32; H01L 21/02491
See application file for complete search history.

(56) References Cited

U.S. PATENT DOCUMENTS

| 8,043,687 B2 | 10/2011 | Kamins et al. |
| 8,663,593 B2 | 3/2014 | Yoo et al. |
| 8,728,433 B2 | 5/2014 | Sutter et al. |
| 8,728,575 B2 | 5/2014 | Li et al. |
| 8,772,181 B2 | 7/2014 | Noda et al. |

OTHER PUBLICATIONS

Chen et al. (Title "Preparation of Copper (Cu)-Nickel (Ni) Alloy Thin Films for Bilayer Graphene Growth") [Feb. 2016].*
B.H. Hong, et al.; "Growth of Graphene Layers for Thin Films"; Thin Film Growth: Physics, Materials Science and Applications; Woodhead Publishing Series in Electronic and Optical Materials by Z. Cao; Jul. 18, 2011, pp. 211-212.
Eugene Zakar, et al.; "Controlling Defects in Fine-Grained Sputtered Nickel Catalyst for Graphene Growth"; Sensors and Electron Devices Directorate, Army Research Laboratory, Adelphi, Maryland; Mar. 7, 2018.

(Continued)

*Primary Examiner* — Tony Tran
(74) *Attorney, Agent, or Firm* — Eric B. Compton

(57) ABSTRACT

A maskless, patterned graphene film is produced through use of a tunable metal as a catalyst for graphene growth. The metal layer contains precisely defined textures that control the formation of the graphene film. Specifically, graphene growth can be controlled from F-LG (few layer graphene) down to 2-LG (2-layer graphene) and 1-LG (1-layer graphene). More than one texture can be created to form maskless patterns of graphene. Once the graphene layer(s) are grown, the film can be released from the metal and applied to any form and shape of rigid or flexible substrate for a variety of different applications where graphene cannot be normally grown directly.

20 Claims, 4 Drawing Sheets

(56) References Cited

OTHER PUBLICATIONS

W.W. Dunn, R.B. McLellan, W.A. Oates, "The solubility of carbon in cobalt and nickel," *Trans. Metall. Soc. AIME 242,* 2129 (1968).
Eugene Zakar, et al.; "Sputter Oriented Nickel and Defect Inhibitors in Graphene"; U.S. Army Research Laboratory, SEDD, 2800 Powder Mill Road, U.S.A.; (2012).
Ahmad Umair, et al.; "Controlled Synthesis of Bilayer Graphene on Nickel"; Nanoscale Research Letters, a SpringerOpen Journal; (2012).
I. Vlassiouk, M. Regmi, P. Fulvio, S. Dai, P. Datskos, G. Eres, "Role of hydrogen in chemical vapor deposition growth of large single-crystal graphene," *ACS Nano,* 5, 6069-6076 (2009).
R.S. Edwards, K.S. Coleman, "Graphene Film Growth on Polycrystalline Metals," *Acc. Chem. Res.,* 46 (1), pp. 23-30 (2013).
A. Chen, E. Zakar, R. Burke, "Preparation of copper (Cu)-nickel (Ni) alloy thin films for bilayer graphene growth," ARL Technical Report, ARL-TR-7593 (2016).
E. Zakar, A. Chen, R. Burke, S. G. Hirsch, N. Strnad, J. Mulcahy, "Characterization of Magnetron Sputtered Copper-Nickel Thin Films and Alloys," ARL Technical Report, ARL-TR-7783 (2016).
E. Zakar, R. Burke, M. Dubey, "Synthesis of Bilayer Graphene on 90/10 Copper (Cu)/Nickel (Ni) Alloy and Transfer by Electrochemical Delamination," ARL Technical Report, ARL-TR-8144 (2017).
David L. Miller, et al.; Epitaxial (111) films of Cu, Ni, and $Cu_xNi_y$ on $\alpha\text{-}Al_2O_3$ (0001) for Graphene Growth by Chemical Vapor Deposition; Journal of Applied Physics 112, 064317 (2012).

\* cited by examiner

MASKLESS PATTERNING AND CONTROL OF GRAPHENE LAYERS

GOVERNMENT INTEREST

The invention described herein may be manufactured, used and licensed by or for the U.S. Government.

BACKGROUND

Field

Embodiments of the present invention generally relate to the field of graphene layer formation and, more specifically, to a method to pattern and control graphene layer formation.

Description of the Related Art

Graphene is an allotrope of carbon and has properties that are useful in electronics, physics, and mechanics. These properties include high strength, high heat and electricity conductivity, and nonlinear diamagnetism. Also, graphene is nearly transparent.

Graphene is generally grown on a metal layer using chemical vapor deposition (CVD). Metals, in particular, nickel (N), has been found to promote graphene formation by a surface growth mechanism, where the metal catalyzes by segregation whereby carbon is first absorbed in the metal at high temperature and upon cooling segregates to the surface to form (grow) graphene. Since segregation is a non-equilibrium process, layer control of graphene is a challenge. Segregation generally results in the growth of "few layer graphene (F-LG)" in a somewhat uniform thin film.

There is a need in the art to control graphene growth down from F-LG to 2-layer (2-LG) and 1-layer (1-LG) for electronic device applications. Previous research has shown that graphene layer thickness can be controlled by adjusting the thickness of the underlying metal layer. However, techniques for controlling patterning of graphene without a mask (maskless) has heretofore not been available.

SUMMARY

Embodiments of the present invention produce a maskless, patterned graphene film through use of a tunable metal as a catalyst for graphene growth. The metal layer contains precisely defined textures that control the formation of the graphene film. Specifically, graphene growth can be controlled from F-LG (few layer graphene) down to 2-LG (2-layer graphene) and 1-LG (1-layer graphene). More than one texture can be created to form maskless patterns of graphene. Once the graphene layer(s) are grown, the graphene film can be released from the metal and applied to any form and shape of rigid or flexible substrate for a variety of different applications where graphene cannot normally be directly grown.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
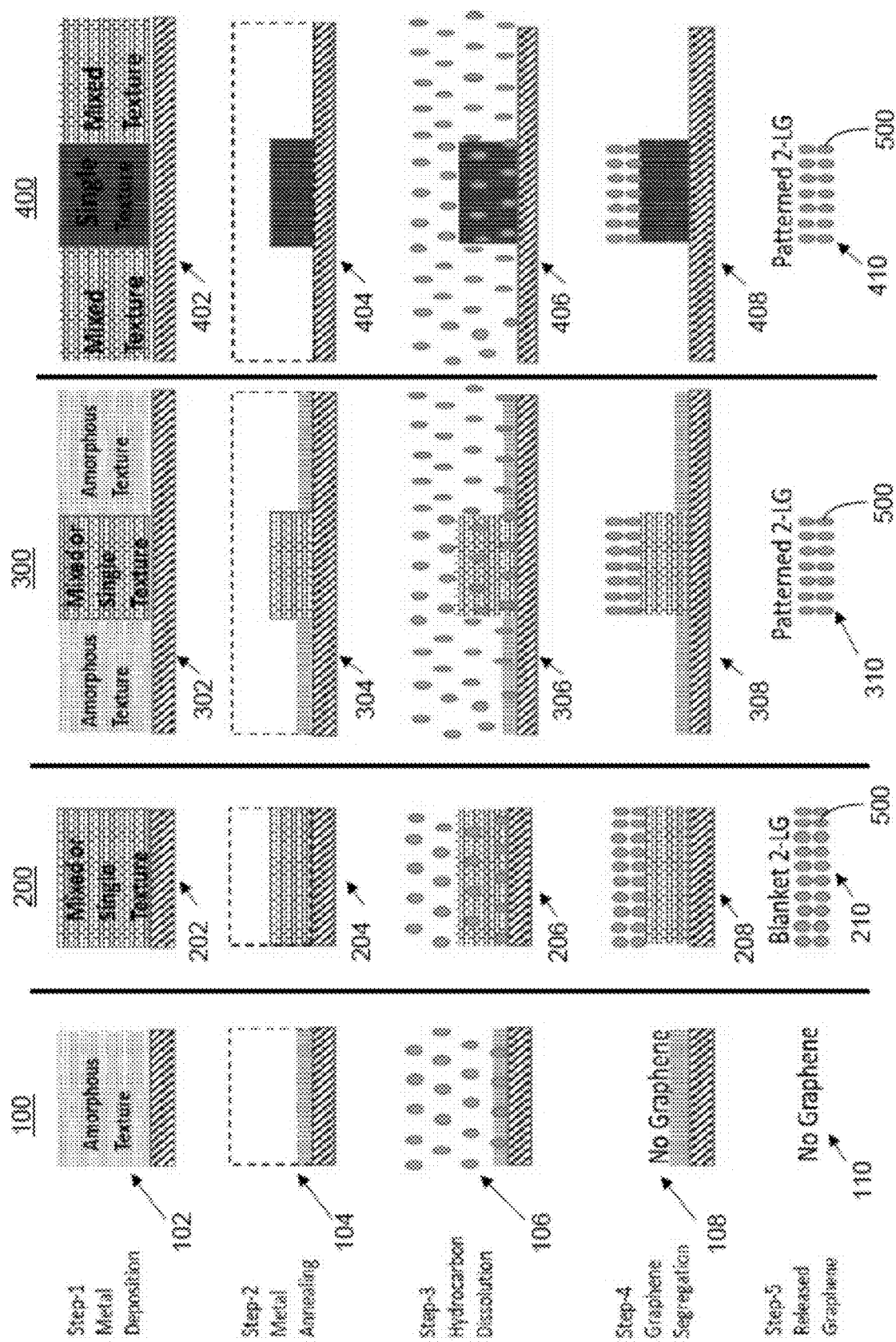
FIG. 1 illustrates four graphene formation processes: (1) a Ni film with an amorphous texture serves as the starting metal, (2) a Ni film with a mixed or single texture serves as the starting metal, (3) a Ni film with an amorphous and a mixed or single texture serves as the starting metal, and (4) a Ni film with a mixed and single texture serves as the starting metal.

Embodiments of the present invention include a maskless, patterned graphene film and a process for creating such a film using a textured metal layer upon which the graphene is grown. The process begins with the creation of a metalized, silicon wafer. The metal, in one embodiment nickel (Ni), but other metals such as platinum (Pt) may be used, is typically sputtered onto the wafer to a thickness of about, for example, 300 nm. The graphene growth process starts with this sputter prepared 300 nm metal thin film and the wafers are then loaded into a high temperature, chemical vapor deposition (CVD) chamber for an annealing step, followed by adding a carbon containing gas, such as methane ($CH_4$) gas, into the same chamber that starts the growth of graphene on the metal surface. The graphene growth process is completed after cooling the samples and removing the wafer from the CVD chamber.

After completing the forgoing process, wafers having rough surface texture do not have graphene growth, but wafers having smooth surface texture have graphene growth. If such rough and smooth surface regions are formed on a single wafer, then the graphene is grown in a pattern defined by the textured regions. Using an X-ray powder diffraction method to inspect the surface structure shows the smooth surface samples as having highly crystalline oriented (111) peak structures, and the rough surface as polycrystalline with mixed (111) and (200) peak structures. Those regions with rough surfaces have very broad or shallow X-ray signals consistent with amorphous structure (non-crystalline).

Additionally, during the graphene growth process, considerable loss of metal thickness occurs during the annealing step, prior to the growth step. The starting metal thickness was 300 nm, but a loss of 180 nm (−60%), 100 nm (−33%), 60 nm (−20%) occurred for metal with amorphous texture, mixed polycrystalline (111) and (200) texture, and single crystalline (111) texture, respectively. A greater variation in metal film thickness can be observed for the amorphous textured regions.

Of note, the metal loss rate is dependent on the texture of the sputter deposited metal. It is important to understand that the thinner the metal layer due to loss, the less hydrocarbon is absorbed in the metal during the graphene growth step. This thinning of the metal results in the suppression of carbon (C), which in turn leads to a more controlled two layer graphene (2-LG) layer growth. Further thinning of the metal forms one layer (1-LG) graphene growth.

Importantly, in one embodiment of this process one metal is used and the final graphene thickness and pattern is tuned "in-situ" through control of the texture configuration, loss rate, annealing time, and temperature.

An embodiment may be used to create patterned arrays of graphene growth on the metal surface by controlling the surface texture of the metal. In one embodiment, a laser beam of sufficient energy can create enough heat on preselected areas of a metal surface to convert the metal from non-crystalline to crystalline structures. The crystalline areas are converted to patterned graphene (maskless) by loading the sample in a CVD chamber for completion of the annealing step followed by exposure to hydrocarbon gas to grow the graphene film.

With reference to FIG. 1, the following describes a specific embodiment of the invention that can be used to pattern and control graphene layer formation. In FIG. 1 illustrates four graphene formation processes: (1) a Ni film with an amorphous texture serves as the starting metal (column of steps 100), (2) a Ni film with a mixed or single texture serves as the starting metal (column of steps 200), (3) a Ni film with an amorphous and a mixed or single texture serves as the starting metal (column of steps 300), and (4) a Ni film with a mixed and single texture serves as the starting metal (column of steps 400). Each column represents a process 100, 200, 300, 400 comprising a sequence of process steps to control the growth of graphene upon a metal layer.

Step 1—Metal Deposition 102, 202, 302, 402

The process 100, 200, 300, 400 begins with sputter deposition of 300 nm layer of fine grained metal Ni or its alloy on an oxidized silicon substrate (wafer). Nickel is one example of the type of metal that can be used. Other metals include, but are not limited to, platinum (Pt), cobalt (Co), iron (Fe), platinum, ruthenium (Ru), rhodium (Rh), and iridium (Ir), All these metals can absorb carbon and their solid solubility-temperature curves are readily available in the published literature. Alloys that make up two or more pure metal such as Ni—Pt, Ni—Cu have been used. Although this embodiment uses a 300 nm thick metal layer, other thicknesses in the range of 100 nm to 1000 nm may be used. Structure of the metal Ni layer can be tuned by addition of blanket heat exposure during the sputter deposition process. Unheated metal deposited at room temperature (25° C.) remains amorphous at 102, when heated to 100° C. becomes crystalline with mixed texture at 202 and 302, and heated to 250° C. becomes crystalline with single texture at 402. Alternatively, it is possible to create crystalline isolated areas mixed/single texture on amorphous as shown at 302 or mixed and single textures as shown at 402 by using laser heating during or post deposition. Other techniques for forming a pattern of amorphous, non-amorphous and mixed textures are known to those skilled in the art such as, for example, but not limited to, thermal substrate heating, pulsed laser deposition (PLD), molecular beam epitaxy (MBE), grazed angle electron beam evaporation, and metal-organic vapor phase epitaxy (MOVPE).

Step 2—Annealing 104, 204, 304, 404

The prepared substrate(s) are then loaded into an atmosphere pressure chemical vapor deposition (APCVD) furnace, the temperature ramped to 1000° C., and held for an annealing time of 10 minutes with 30 vol. % $H_2$ and remaining balance of Argon (Ar). A considerable Ni metal loss of approximately 60%, 33%, 20% occurs for amorphous (at 104), mixed (111) and (200) texture (at 204 and 304), and single (111) (at 404) textures, respectively. In this embodiment, the rate loss for the amorphous, mixed, and single textures are 20 nm/min., 10 nm/min., and 6 nm/min, respectively. An annealing process prior to graphene growth is used to remove native surface oxide and increase the grain size of the meal to facilitate growth of high-quality graphene films. $H_2$ with 30 vol. % is used to reduce the number of pitting defects on the metal surface.

Step 3—Hydrocarbon Dissolution 106, 206, 306, 406

Carbon dissolution is introduced into existing textured metal at 106, 206, 306, 406 by addition of 0.3 vol. % C precursor gas for 10 minutes. Again, the metal thickness limits the amount of carbon dissolution in this step. $CH_4$ is the most popular C precursor gas for graphene growth due to its low pyrolysis rate, but acetylene ($C_2H_2$) and ethylene ($C_2H_4$) have higher pyrolysis rate can be used. Other possible carbon precursors can be found in the form of a liquid (benzene, ethanol, isopropanol, methanol, soybean) or a solid (polystyrene, poly(methyl methacrylate)).

Step 4—Graphene Segregation 108, 208, 308, 408

In one embodiment, a slow cool down rate of 5° C./min is used to orderly segregate out the C to produce good quality graphene staking layers. The flow rates of $CH_4$, $H_2$, and Ar are maintained. $H_2$ in this step aids in the etching away of unwanted amorphous carbon. Substrates are removed from CVD upon reaching room temperature and gases turned off. As discussed above, graphene growth patterns (including whether graphene grows at all) depend on the underlying metal textures:

In the case of blanket amorphous metal texture at 108, no graphene growth.

In the case of blanket mixed or a single metal structure at 208, 2-LG growth can be tuned by the annealing time.

In the case of amorphous and mixed/single texture metal surface at 308, a pattern of 2-LG can grow only on the mixed/single metal texture but not on amorphous surface.

In the case of mixed texture and single metal textures at 408, 2-LG grows on the remaining single metal texture by virtue of its slowest metal loss rate.

Further tuning of the thickness of the underlying metal to a thinner layer results in 1-LG graphene growth such that a pattern of 1-LG, 2-LG or no graphene is possible. As such, a patterned graphene film can be formed comprising a first region of either no graphene, 1-LG graphene or 2-LG graphene, and a second region of either no graphene, 1-LG graphene or 2-LG graphene, wherein the graphene in the first region and second region are different.

Step 5—Release 110, 210, 310, 410

Graphene is released from the underlying metal layer by well-known wet etching or dry stamping methods at 110, 210, 310 410. The released pattern graphene film 500 can then be transferred to other forms and shapes of substrates (not shown) such as plastic, fabric, etc. were no graphene could be grown directly. Transfer recipes are available and well-known to those skilled in the art.

The following described data illustrates the results of preliminary testing conducted by the inventor to establish proof of principle regarding embodiments of this invention.

It is understood that Raman signals having peaks in the G band (1500-1600 $cm^{-1}$) and G' band (2700-2800 $cm^{-1}$) are standard signatures of graphene. Those peaks can be characterized according to number of layers and to a greater detail how the individual crystal layers are oriented and stacked. Additionally, the quality of the stacking from best to worst is AB, twisted, and turbostratic. When the Raman peak characteristics are depicted in grayscale and a cluster algorithm mapped, a pictorial representation of the graphene layers and qualities can be represented.

Figure 2A:
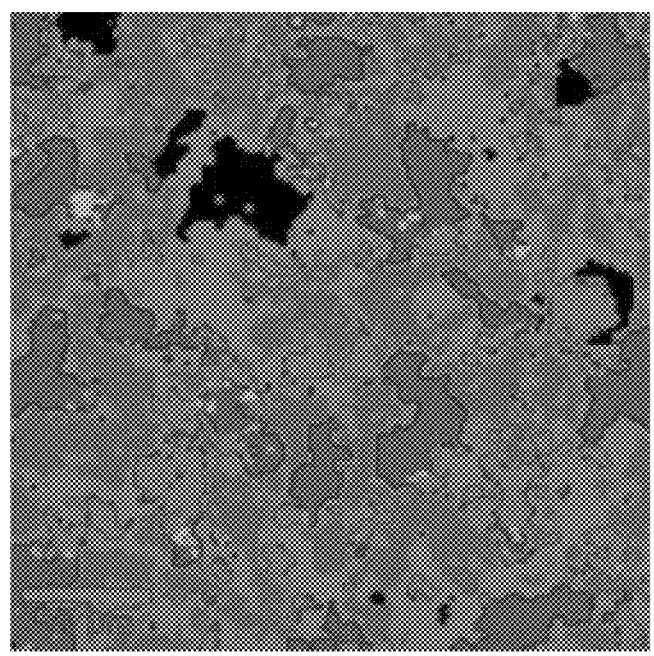
FIG. 2A illustrates a Cluster algorithm map showing a sample surface coverage of graphene layers in grayscale.
Figure 2B:
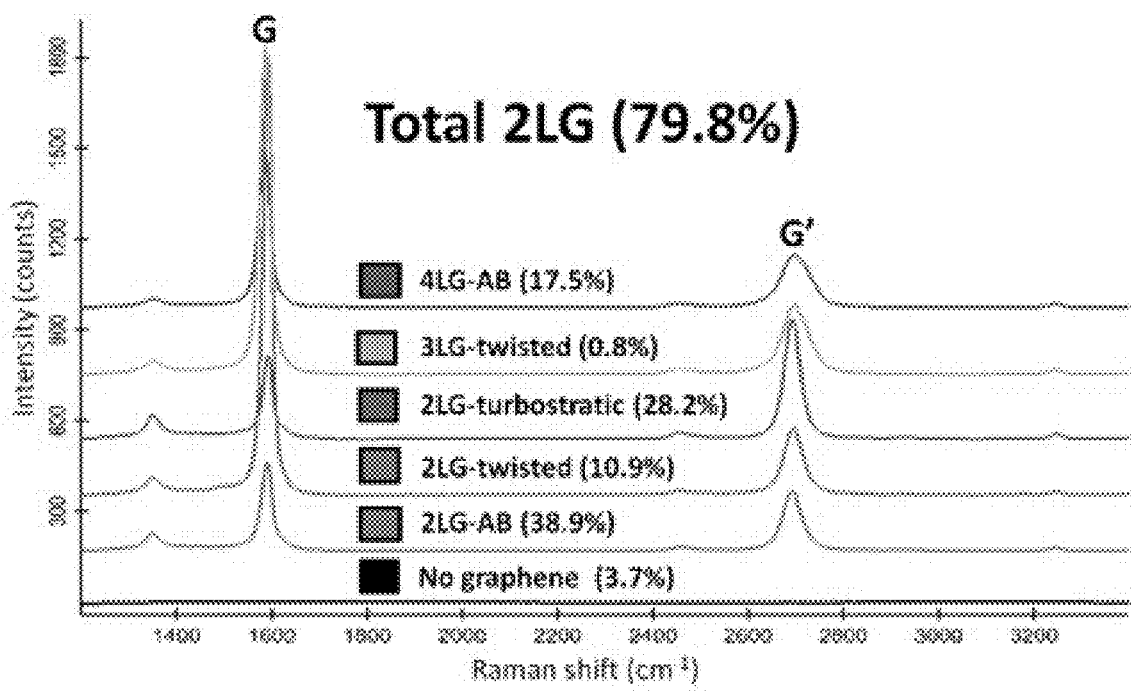
FIG. 2B illustrates corresponding Raman signatures.

FIG. 2A illustrates a Cluster algorithm map showing a sample surface coverage of graphene layers in grayscale. The darker the grayscale means a greater degree of graphene coverage. FIG. 2B illustrates corresponding Raman signatures showing total 2LG. The sample area of the surface is 50 um×50 um where a metal loss of 60 nm (−20%) produced 79.8% 2-LG coverage and remaining 21.2% FLG coverage consisting of 3LG and 4LG.

Figure 3A:
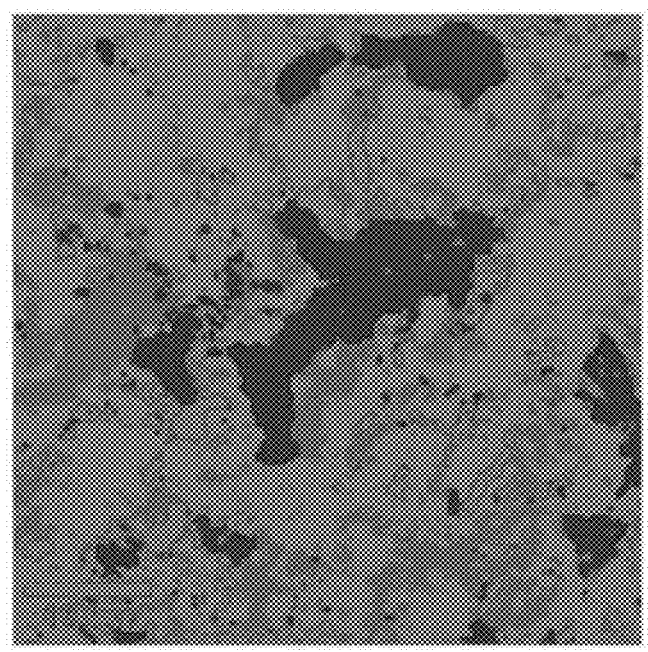
FIG. 3A illustrates a Cluster algorithm map showing a sample surface coverage of graphene layers in grayscale.
Figure 3B:
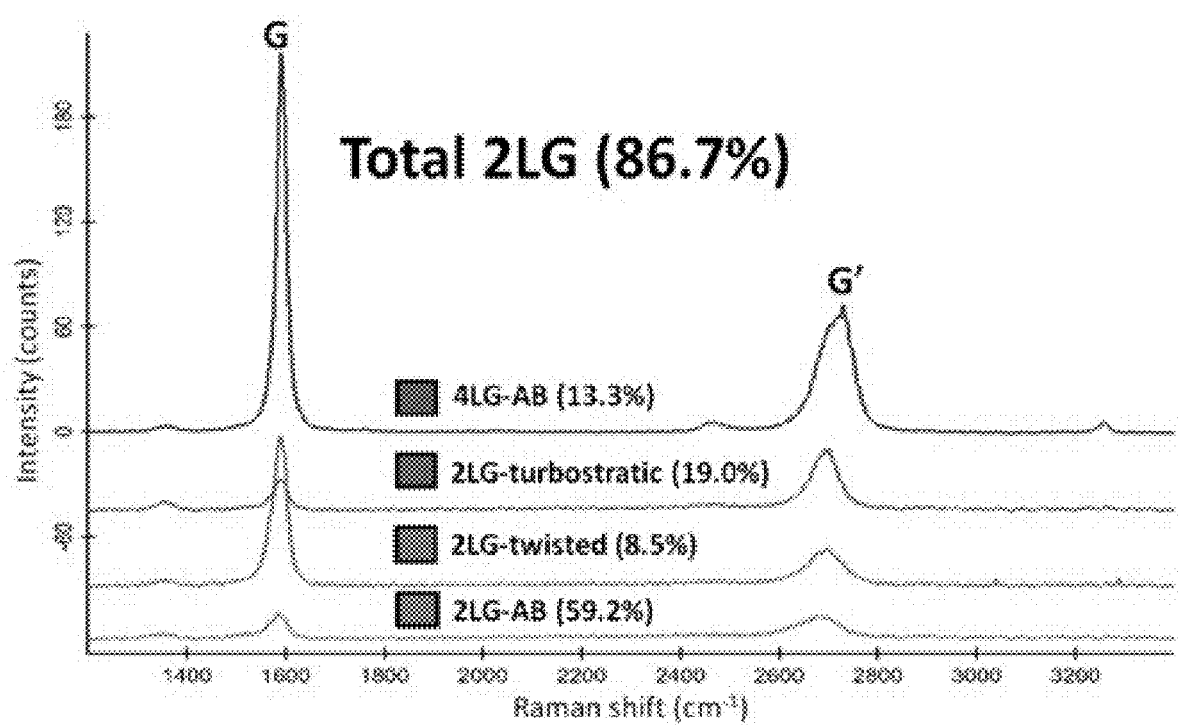
FIG. 3B illustrates corresponding Raman signatures.

FIG. 3A illustrates a Cluster algorithm map showing a sample surface coverage of graphene layers in grayscale. The darker the grayscale means a greater degree of graphene coverage. FIG. 3B illustrates corresponding Raman signatures showing total 2LG. They show, when the metal loss increased to 100 nm (−33%), the coverage increased to 86.7% 2-LG and the FLG decreased to 13.3%. It was demonstrated that using the same exact process recipe, metal loss can lead to more controlled 2-LG and a decrease in the FLG due to less hydrocarbon being absorbed in the metal during the methane growth step. There is also a quality improvement since the amount of higher quality 2LG-AB stacking increases from a low 38.9% in FIG. 2B to high 59.2% in FIG. 3B.

Figure 4:
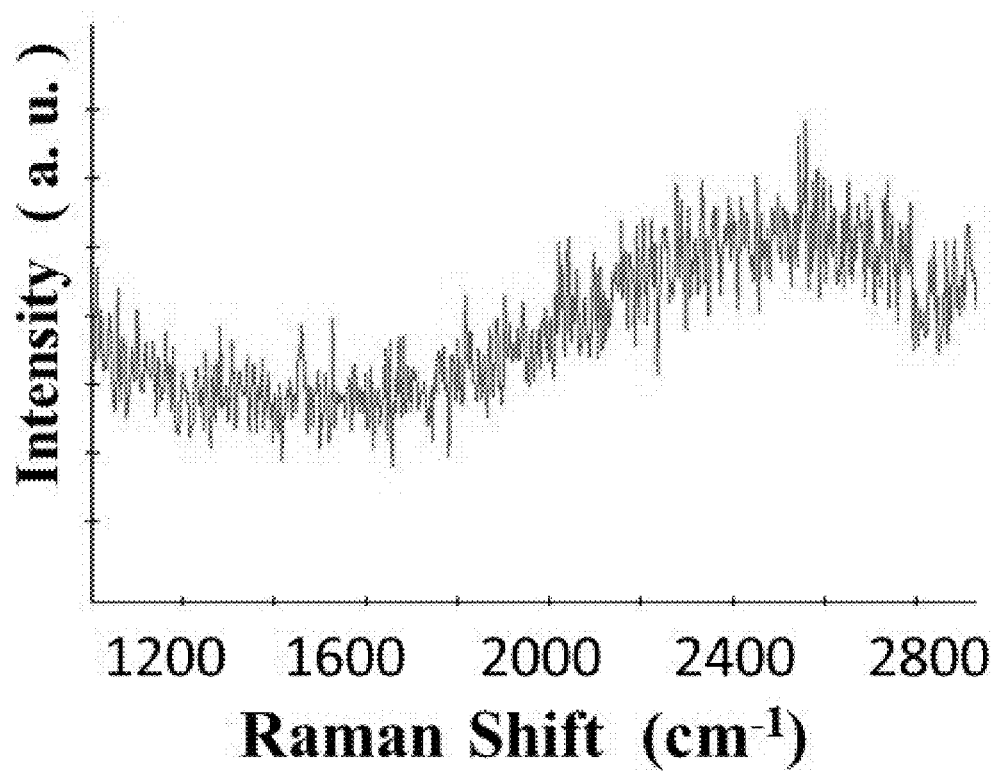
FIG. 4 is a Raman plot of a sample with amorphous metal texture and no graphene growth.

FIG. 4 is a Raman plot of a sample with amorphous metal texture after it has been exposed to methane gas. It shows no graphene growth as evidenced by the missing peaks in the G band (1500-1600 cm$^{-1}$) and G' band (2700-2800 cm$^{-1}$). The results demonstrate that graphene does not grow on top of a non-crystalline (i.e., amorphous texture) metal surface.

A reduction in metal thickness has been experimentally shown to control the number of graphene layers from few layer graphene (F-LG) down to 2-LG. Also, the inventor speculates that a further reduction in the metal thickness to 35-100 nm can control/reduce the graphene layers down to one layer graphene (1-LG), as theory suggests 35 nm of Ni at 1000° C. can absorb only enough C to form 1-LG.

Graphene films formed in accordance with embodiments of the invention disclosed herein may find use in technologies such as, but not limited to: Field Effect Transistor (FET) for flexible and wearable RF communications; Light weight shielding against electromagnetic interference in electronic devices; Gas sensors for safety monitoring; Chemical and biological detection sensors; Rust inhibitor coating; Transparent electrodes for telephone and computer display devices; Filters for optoelectronics devices; Filters for water purification process; and Electrode for low contact resistance fabrics.

While the foregoing is directed to embodiments of the present invention, other and further embodiments of the invention may be devised without departing from the basic scope thereof, and the scope thereof is determined by the claims that follow.

REFERENCE NUMERALS ARL19-12

100 process
102 metal deposition
104 annealing
106 hydrocarbon dissolution
108 graphene segregation
110 release
200 process
202 metal deposition
204 annealing
206 hydrocarbon dissolution
208 graphene segregation
210 release
300 process
302 metal deposition
304 annealing
306 hydrocarbon dissolution
308 graphene segregation
310 release
400 process
402 metal deposition
404 annealing
406 hydrocarbon dissolution
408 graphene segregation
410 release

The invention claimed is:

1. A method for selective growth and patterning of graphene, the method comprising:
   depositing a fine-grained metal or alloy on an oxidized silicon substrate;
   selectively annealing the metal during or post metal deposition to pattern one or more discrete regions of the metal which change the structure of the metal to amorphous, mixed texture, single texture or a combination thereof;
   performing hydrocarbon dissolution by introducing a carbon precursor gas into the atmosphere pressure chemical vapor deposition furnace;
   growing a graphene layer by cooling the furnace at a defined rate while maintaining existing atmospheric composition, where graphene grows only upon patterned metal having mixed or single texture and does not grow on patterned metal having an amorphous texture; and
   releasing a graphene layer from the metal.

2. The method of claim 1, wherein annealing is performed using a laser.

3. The method of claim 2, wherein the laser forms a pattern on the metal of first regions with amorphous texture and second regions with mixed or single texture.

4. The method of claim 1, wherein the carbon precursor gas is $CH_4$, $C_2H_2$, or $C_2H_4$.

5. The method of claim 1, wherein the metal is nickel or an alloy of nickel.

6. The method of claim 1, wherein annealing further comprises placing the substrate into an atmosphere pressure chemical vapor deposition furnace at a temperature of 1000° C. and with an atmosphere of 30 vol. % $H_2$ and remaining balance of Argon for 10 minutes.

7. The method of claim 1, wherein hydrocarbon dissolution is performed for about 5 minutes.

8. The method of claim 1, wherein releasing the graphene film further comprises dry stamping or wet etching.

9. The method of claim 1, wherein an amount of carbon precursor gas is 0.3 vol. % carbon precursor gas.

10. The method of claim 1, wherein, by the selectively annealing the metal in a pattern, the subsequent growth and/or no growth of graphene on the patterned metal does not require a mask.

11. A method for selective growth and patterning of graphene, the method comprising:
    depositing a fine-grained metal or alloy on an oxidized silicon substrate;
    selectively heating the metal using laser heating to pattern one or more discrete regions of the metal which change the structure of the metal to amorphous, mixed texture, single texture or a combination thereof;
    performing hydrocarbon dissolution by introducing a carbon precursor gas into the atmosphere pressure chemical vapor deposition furnace;

growing a graphene layer by cooling the furnace at a defined rate while maintaining existing atmospheric composition, where graphene grows only upon patterned metal having mixed or single texture and does not grow on patterned metal having an amorphous texture; and releasing a graphene layer from the metal.

12. The method of claim 11, wherein heating the metal occurs during metal deposition or post metal deposition.

13. The method of claim 11, wherein the laser forms a pattern on the metal of first regions with amorphous texture and second regions with mixed or single texture.

14. The method of claim 11, wherein the carbon precursor gas is $CH_4$, $C_2H_2$, or $C_2H_4$.

15. The method of claim 11, wherein the metal is nickel or an alloy of nickel.

16. The method of claim 11, wherein, after the heating step, annealing by placing the substrate into an atmosphere pressure chemical vapor deposition furnace at a temperature of 1000° C. and with an atmosphere of 30 vol. % $H_2$ and remaining balance of Argon for 10 minutes.

17. The method of claim 11, wherein hydrocarbon dissolution is performed for about 5 minutes.

18. The method of claim 11, wherein releasing the graphene film further comprises dry stamping or wet etching.

19. The method of claim 11, wherein an amount of carbon precursor gas is 0.3 vol. % carbon precursor gas.

20. The method of claim 11, wherein, by selectively heating the metal in a pattern, the subsequent growth and/or no growth of graphene on the pattered metal does not require a mask.

* * * * *